US011101009B1

(12) United States Patent
Ray (10) Patent No.: US 11,101,009 B1
(45) Date of Patent: Aug. 24, 2021

(54) SYSTEMS AND METHODS TO CONVERT MEMORY TO ONE-TIME PROGRAMMABLE MEMORY

(71) Applicant: Biswajit Ray, Madison, AL (US)

(72) Inventor: Biswajit Ray, Madison, AL (US)

(73) Assignee: Board of Trustees of the University of Alabama, for and on behalf of the University of Alabama in Huntsville, Huntsville, AL (US)

(*) Notice: Subject to any disclaimer, the term of this patent is extended or adjusted under 35 U.S.C. 154(b) by 0 days.

(21) Appl. No.: 16/808,924

(22) Filed: Mar. 4, 2020

Related U.S. Application Data

(60) Provisional application No. 62/813,492, filed on Mar. 4, 2019.

(51) Int. Cl.
| | |
|---|---|
| *G11C 16/34* | (2006.01) |
| *G06F 12/02* | (2006.01) |
| *G11C 7/10* | (2006.01) |
| *G11C 16/16* | (2006.01) |

(52) U.S. Cl.
CPC ...... *G11C 16/3495* (2013.01); *G06F 12/0246* (2013.01); *G11C 7/1006* (2013.01); *G11C 16/16* (2013.01); *G11C 16/3445* (2013.01)

(58) Field of Classification Search
None
See application file for complete search history.

(56) References Cited

U.S. PATENT DOCUMENTS

| | | | | |
|---|---|---|---|---|
| 7,035,964 | B1* | 4/2006 | Kohler | G06F 8/65 365/195 |
| 7,136,303 | B2* | 11/2006 | Smith | G11C 17/16 365/185.08 |
| 7,491,948 | B2 | 2/2009 | Gordon et al. | |
| 8,199,590 | B1* | 6/2012 | Novosel | G11C 17/16 365/189.2 |
| 8,331,128 | B1* | 12/2012 | Derhacobian | G11C 11/56 365/148 |
| 8,335,098 | B2* | 12/2012 | Shen | G11C 17/18 365/94 |
| 8,611,138 | B1* | 12/2013 | Chu | G11C 17/16 365/156 |
| 8,861,250 | B1* | 10/2014 | Wu | H01L 27/11266 365/104 |
| 9,530,512 | B2 | 12/2016 | Ray et al. | |

(Continued)

OTHER PUBLICATIONS

Irom, et al., "Single Event Effect and Total Ionizing Dose Results of Highly Scaled Flash Memories," Radiation Effects Data Workshop (REDW), 2013 IEEE, pp. 1-4, Jul. 2013.

(Continued)

*Primary Examiner* — Tan T. Nguyen
(74) *Attorney, Agent, or Firm* — Maynard Cooper & Gale, P.C.; Jon E. Holland (57) ABSTRACT

A memory system is configured to convert multiple programmable memory or a portion thereof to one-time programmable (OTP) memory. The system is configured to repetitively perform memory operations (such as program and erase procedures) on a portion of memory in order to induce accelerated degradation (aging) of select memory cells, thereby permanently changing the select cells, such that a pattern of the cells with degraded performance indicate a data value that has been permanently encoded into the memory.

10 Claims, 4 Drawing Sheets

(56) References Cited

U.S. PATENT DOCUMENTS

| | | |
|---|---|---|
| 9,543,028 B2 | 1/2017 | Ray et al. |
| 9,705,320 B1 | 7/2017 | Petrick |
| 10,403,366 B1 | 9/2019 | Tabrizi et al. |
| 10,509,132 B1 | 12/2019 | Ray et al. |
| 2004/0041197 A1 | 3/2004 | Jong et al. |
| 2004/0191989 A1 | 9/2004 | Ngo |
| 2006/0083060 A1* | 4/2006 | Riva Reggiori ....... G11C 16/22 365/185.04 |
| 2008/0232162 A1* | 9/2008 | Kuan ................... H01L 27/112 365/185.1 |
| 2010/0140488 A1 | 6/2010 | Visconti |
| 2010/0240156 A1 | 9/2010 | Suhail et al. |
| 2014/0026653 A1 | 1/2014 | Del Signore et al. |
| 2014/0098605 A1* | 4/2014 | Long ..................... G11C 17/16 365/185.01 |
| 2017/0110199 A1 | 4/2017 | Li et al. |

OTHER PUBLICATIONS

Grupp, et al., "Characterizing Flash Memory: Anomalies, Observations, and Applications," 2009 42nd Annueal IEEE/ACM International Symposium on Microarchitecture, 2009, pp. 24-33.

Ray, et al., "True Random Number Generation Using Read Noise of Flash Memory Cells," IEEE Transactions on Election Devices, Mar. 2018, pp. 963-969, vol. 65, No. 3.

Ray, et al., U.S. Appl. No. 16/415,588, entitled, "Systems and Methods for Sensing Radiation using Flash Memory," filed May 17, 2019.

Ray, et al., U.S. Appl. No. 16/273,062 entitled, "Systems and Methods for Hardening Flash Memory to Radiation," filed Feb. 11, 2019.

* cited by examiner

SYSTEMS AND METHODS TO CONVERT MEMORY TO ONE-TIME PROGRAMMABLE MEMORY

CROSS REFERENCE TO RELATED APPLICATION

This application claims priority to U.S. Provisional Patent Application No. 62/813,492, entitled "Prospect of Flash Memory as a Secure and Reliable One-Time Programmable (OTP) Memory," and filed on Mar. 4, 2019, which is incorporated herein by reference.

RELATED ART

Memory is an important element in a variety of electronic and computer applications. Memory may include volatile and nonvolatile memory. Volatile memory usually loses the data stored therein with a loss of power. Nonvolatile memory can preserve information even after power cycling. Nonvolatile memory includes read only memory and read/writeable memory. Read only memory (ROM) can be useful in many circumstances to store data or instructions that are not intended to change. However, the creation of ROMs is sometimes an expensive and time consuming process requiring specialized hardware.

A variety of one-time programmable memories have been developed. Most of these technologies involve the use of fuses or anti-fuses. These one-time programmable (OTP) memories are more expensive and less dense (data storage/physical size) than comparable read/write memories such as NAND flash memory.

NAND flash memory is generally the most popular commercial nonvolatile memory (NVM) option due to its high density (e.g., greater than 1 terabyte (TB)/square inch) along with its relatively low cost (e.g., less than $1/gigabyte (GB)), lightweight and low power consumption, making it very attractive for a variety of electronic systems.

Some existing solutions have been tried to overcome or mitigate the costs and other drawbacks associate with OTP memory by converting a portion of the NAND flash memory chip to OTP memory. Specifically, attempts have been made to convert NAND flash memory to OTP memory by disabling the erase and re-writing options on certain selected blocks of the chip (often through the memory controller). However, recent studies show that the contents of these NAND flash cells can be easily modified by different semi-invasive attacks (e.g., optical fault injection, bumping attack, localized heating, etc.). In addition, flash memory suffers from different reliability issues (e.g., read disturb, data retention, etc.). All these reliability and security issues pose a significant threat for using NAND flash as OTP memory. It would be helpful to have one-time programmable memory with the benefits cost and density of multiple read/writable memory without the aforementioned drawbacks.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for converting multiple programmable memory or a portion thereof to one time programmable (OTP) memory. In some embodiments of the present disclosure, memory operations (such as program and erase procedures) are performed repetitively on a portion of memory in order to induce accelerated degradation (aging) of select memory cells, thereby permanently changing the select cells, such that a pattern of the cells with degraded performance indicate a data value that has been permanently encoded into the memory. Multiple programmable memory, such as flash memory, can be converted into OTP memory according to the techniques described herein to store a variety of data values that a user, developer, or manufacturer does not want to change (e.g., serial numbers, cryptographic keys, manufacturing dates, etc.).

Figure 1:
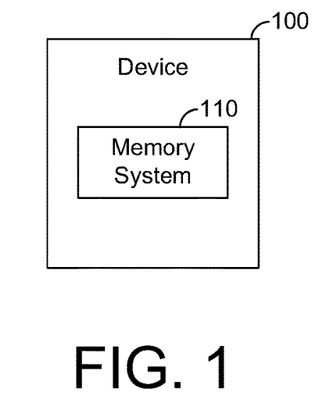
FIG. 1 is a block diagram illustrating an exemplary device with a flash memory.

FIG. 1 is a block diagram illustrating an exemplary device 100 with a multiple programmable memory. In the context of this disclosure, "multiple programmable memory" generally refers to memory that is configured such that multiple program or write operations may be performed on the same memory spaces or cells. As an example, conventional RAM and flash memory are examples of multiple programmable memory in that the memory locations of such memory is configured such that it may be written to and overwritten several times. ROM on the other hand is memory that, by definition, can be written to only once and, thus, does not constitute multiple programmable memory.

The device 100 shown by FIG. 1 has a memory system 110 comprising multiple programmable memory for storing data. The device 100 may include, but is not limited to, smartphones, mobile devices, tablets, personal digital assistants, personal computers, game consoles, game cartridges, or other devices, and the memory system 110 may be a memory card, a Universal Serial Bus flash drive, a solid-state drive or other types of memory. In an exemplary embodiment, the memory 110 may be a NAND flash architecture, although in other embodiments other types of devices 100 and other types of memory 110 may be possible.

Figure 2:
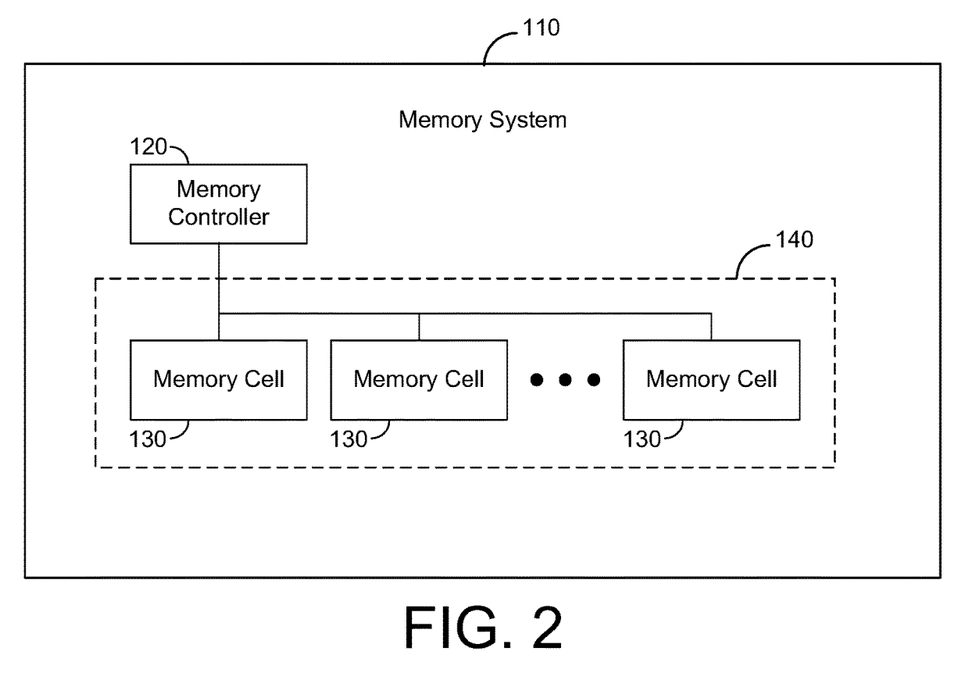
FIG. 2 is a block diagram illustrating an exemplary embodiment of a memory system.

FIG. 2 depicts a memory system 110 having a plurality of memory cells 130. In actuality, the memory system 110 may have any number of memory cells (e.g., from one to a trillion or more), but in the figure a few memory cells 130 are shown for simplicity of description. The memory cells 130 may be flash memory configured as NOR, NAND, VNAND or other types or arrangements. Unless otherwise indicated, it will be assumed that the memory cells shown by FIG. 2 and described herein are NAND flash memory cells, but it should be emphasized that other types of memory cells are possible (NOR flash, Resistive RAM, Ferroelectric RAM, etc.). In addition, each cell 130 of the memory system 110 may be configured for storing a desired number of charge states (e.g., bits) per cell, such as single level cell (SLC), multi-level cell (MLC), triple-level cell (TLC) or otherwise. The memory cells 130 can be located on one or more memory chips 140. Within some classes of memory chips 140, memory cells are set up in blocks and pages. A page represents the smallest unit that can be programmed to a memory chip 140. A block represents the smallest unit that can be erased from a memory chip 140. In some embodiments, there are multiple pages within each block.

As shown by FIG. 2, the memory cells 130 are coupled to a memory controller 120 that is configured to perform memory operations, such as reading, erasing, and programming (i.e., writing) on the memory cells 130 similar to other memory controllers known in the art. The memory controller 120 may be implemented in hardware or a combination of hardware and software. As an example, the memory controller 120 may be implemented exclusively in hardware, such as an ASIC, a field programmable gate array, or other type of circuitry configured to perform memory operations. In another example, the memory controller 120 may comprise a processor, such as digital signal processor (DSP) or central processing unit (CPU), that is configured to execute software to perform one or more function of the memory controller 120.

As known in the art, memory operations may be performed by applying specific voltages on connections or "lines," such as word lines and bit lines, connected to one or more memory cells 130 as appropriate for performing the desired operation. In some embodiments, memory cells 130 may be located on one or more memory chips 140 (i.e., an integrated circuit chip with memory), and the memory controller may be on a separate integrated circuit (IC) chip that is electrically coupled to the memory chip 140. The memory controller 120 may transmit to a memory chip 140 a request to perform a memory operation, and the memory chip 140 may perform the requested operation by applying voltages as appropriate to the memory cells 130 of the memory chip 140.

Figure 3:
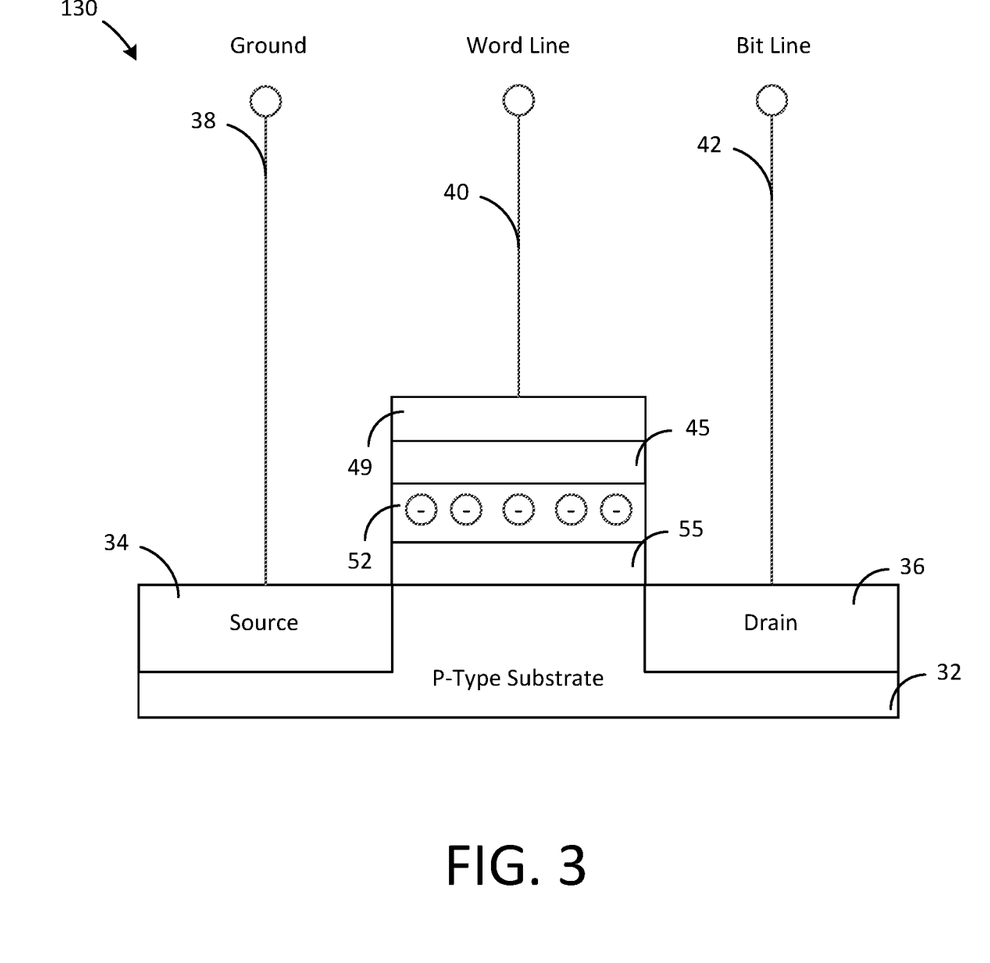
FIG. 3 is a block diagram illustrating an exemplary embodiment of a flash memory cell, such as is depicted by FIG. 2.

Flash memory is generally a type of non-volatile semiconductor memory that stores information in the form of charge on one or more floating gates 52. FIG. 3 depicts an exemplary embodiment of a flash memory cell 130, such as is depicted by FIG. 2. The memory cell 130 of FIG. 2 is depicted as essentially a standard flash memory cell and has a substrate 32, source 34, drain 36, ground line 38, word line 40, and bit line 42. The memory cell 130 has a blocking oxide 45 below the control gate 49 and tunnel oxide 55 below the floating gate 52. Voltage may be applied to the cell 130 via the lines 38, 40, 42 to perform read/erase/program operations. Structurally, a flash memory cell 130 comprises a floating gate metal-oxide-semiconductor field effect transistor (FG-MOSFET) 52, which allows electrons from the silicon substrate 32 to be tunneled into the floating gate 52 during the program operation (e.g., by applying a large positive charge differential across the control gate 49 and the substrate 32). The erasure operation uses tunneling to remove electrons from the floating gate 52 to the substrate 32 (e.g., by applying a large negative charge differential across the control gate 49 and the substrate 32). A programming operation may change selected memory cells 130 within a page from one bit value (e.g., "1") to another bit value (e.g., zero "0"). An erase operation may change all memory cells 130 within a block to a particular bit value (e.g., one "1"). In such embodiments, memory cells 130 already storing this particular bit value do not change during the erase operation. In some embodiments, memory cells 130 storing a value that changes during an operation experience more stress than memory cells 130 storing a value that is not changed by the operation. Moreover, repeatedly performing operations that change the stored bit value in a memory cell can degrade performance of the memory cell such that the memory cell eventually fails (i.e., is unable to change the stored bit value).

Indeed, successive program and erase operations have been known to cause degradation (e.g., wearing out or aging) of flash memory cells 130 and other types of memory cells. When flash memory was first developed, this degradation or wearing out could happen after hundreds or thousands of program and erase cycles to the extent the memory cells 130 were no longer useable. As flash technology improved, the flash memory cells 130 could successfully withstand tens to hundreds of thousands of program and erase cycles. Some cells 130 still function after a million program erase cycles. Notwithstanding a cell's ability to be programmed and erased tens of thousands of times or more, such successive program erase operations generate structural changes to the memory cells 130 which in turn cause changes to the memory cell's performance characteristics. In some embodiments, these changes to memory cell characteristics affect the time needed to perform program or erase operations on a memory cell 130. Changes to cell characteristics may be detected by performing partial (shortened) erase or programing operations as will be described later. Using these differences in performance characteristics, information may be encoded by causing the accelerated degradation of select memory cells 130. While a particular type of flash memory cell 130 has been presented, the principles herein apply to other flash memory configurations and other rewriteable memory types as well which experience degradation through successive or excessive usage.

In some embodiments, the performance degradation resulting from repeated stressing of memory cells in multiple programmable memory, such as flash memory, is exploited to convert a portion of the multiple programmable memory to OTP memory encoded with a data value. In this regard, a set of memory cells may be selected for repeated programming based on the data value to be encoded. As an example, within a portion of the memory to be encoded with a data value (such as a block of memory), referred to hereafter as the "encoded portion" of memory, a set of memory cells used for storing bits of the data value having a certain logical level (e.g., logical low level or "0") may be selected for repeated stressing. The memory controller 120 may then perform repeated stressing on the selected memory cells 130 by repetitively changing the data value stored in each selected memory cell 130 a sufficiently large number of times such that the performance of these selected memory cells 130 becomes substantially degraded.

In this context, memory cell performance that has been "substantially" degraded generally refers to a memory cell that has undergone a sufficient amount of performance degradation such that a measurable difference in performance exists between the degraded memory cell and a new memory cell to enable the degraded memory cell to be distinguished from the new memory cell based on the relative performance characteristics of the two memory cells. There are various techniques that can be used to repeatedly stress the selected memory cells 130 such that they become substantially degraded. In this regard, the memory controller 120 may repetitively change the data value stored in each selected memory cell a large number of times, such as several hundred or thousand times. As an example, the memory controller 120 may perform many program-erase (PE) cycles where, for each PE cycle, a certain bit value is written to each of the selected memory cells and then erased or otherwise changed. Notably, the program operation is performed such that the bit value is written only to the selected memory cells such that the values stored in the non-selected memory cells of the encoded portion of memory are not changed by the PE cycles. Thus, the PE cycles substantially degrade the performance of the selected memory cells 130 in the encoded portion of memory without substantially degrading the non-selected memory cells 130 in the encoded portion of memory, thereby encoding the data value into such portion of memory as will be described in more detail below. In other embodiments, other techniques for stressing the selected memory cells or changing their stored values are possible.

After the repeated stressing has been performed to substantially degrade the performance of selected memory cells 130, the pattern of substantially degraded memory cells resulting from the repeated stressing operations within the encoded portion of memory is indicative of the data value that has been encoded into the memory. As an example, the encoded portion of the memory may be analyzed to determine which of the memory cells are substantially degraded and which of the memory cells are not. This pattern corresponds to a bit pattern reflective of the encoded data value. That is, to recover the encoded data value, the substantially degraded memory cells may be identified as being encoded with a particular bit value (e.g., "0"), and the other memory cells that are not substantially degraded may be identified as being encoded with a different bit value (e.g., "1"). Thus, the memory cells can be analyzed to determine the sequence of bit values that define the encoded data value.

Further, since the substantial degradation of performance to the selected memory cells 130 is permanent, the data value that is encoded into the memory cells using the performance characteristics of the cells cannot be freely changed, and this value shall be referred to herein as an OTP value. That is, a memory cell that has been substantially degraded cannot be returned to a state where the memory cell is no longer substantially degraded. Thus, using these techniques, a data value may be encoded into the memory cells only once, and this value remains encoded into the memory even as the bit values actually stored in the memory cells change over time. That is, even after the memory cells are encoded with an OTP data value through repeated stressing operations, as described above, the memory cells 130 remain operational for writing or reading data values into and out the memory cells using normal memory operations, and at any time, the encoded OTP data value may be recovered from such memory cells using the techniques described herein. However, due to the reduced performance of the substantially degraded memory cells, it may be desirable to use other memory locations for storing other data values used by the device 100.

Figure 6:
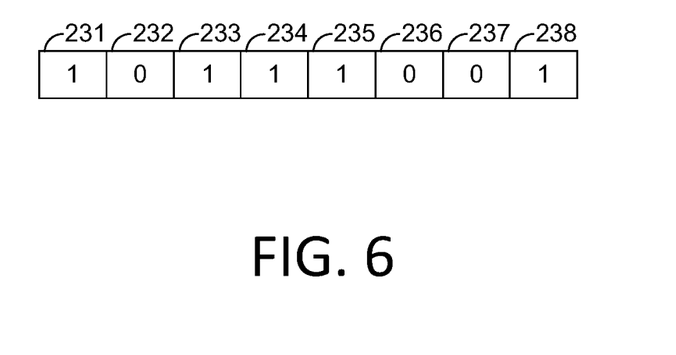
FIG. 6 is a block diagram illustrating a group of memory cells of multiple programmable memory encoded with a data value.

To better illustrate the foregoing, assume that it is desirable to encode a portion of multiple programmable memory with the following eight-bit binary data value "10111001." In such example, the memory controller 120 may allocate to the encoding operation memory represented by at least eight memory cells 231-238 (FIG. 6). The memory controller 120 may then perform a large number of PE cycles on the memory cells 231-238 such that performance of the memory cells 232, 236, and 237 become substantially degraded. In this regard, for each PE cycle, the memory controller 120 (1) erases the memory cells 231-238 such that all of the memory cells 231-238 are forced to a bit value of "1" and (2) writes the data value to the memory cells 231-238 such that the memory cells 232, 236, and 237 are forced to a different value (i.e., a bit value of "0"). Thus, after performance of the large number of PE cycles, the memory cells 232, 236, and 237 are substantially degraded. Notably, however, the bit values stored in the memory cells 231, 233-235, and 238 are not changed by the PE cycles, and the performances of these memory cells 231, 233-235, and 238 thus are not substantially degraded by the PE cycles. After completion of the PE cycles, the data value "10111001" has been encoded into the memory cells 231-238 based on the performance characteristics of the memory cells 231-238. That is, the performances of the memory cells 232, 236, and 237 representing the "0's" in the encoded data value are substantially degraded, and the performances of the memory cells 231, 233-235, and 238 representing the "1's" in the encoded data value are not substantially degraded.

To recover the encoded data value from the memory cells 231-238, the memory controller 120 may perform one or more memory operations indicative of the performance of the memory cells 231-238 in order to determine which of the memory cells 231-238 have substantially degraded performance. In one embodiment, this may be achieved by performing one or more partial memory operations such that cell with substantially degraded performance likely store one bit value and memory cells with performance that has not been substantially degraded likely store another bit value. As an example, the memory controller 120 may perform a program or erase operation to store the same bit value in each of the memory cells 231-238 and then perform another program or erase operation (e.g., a partial program or erase operation) such that the memory cells not substantially degraded transition to a new bit value. The memory cells that transition to a new bit value may then be identified as not substantially degraded, and the memory cells that do not transition to the new bit value may be identified as substantially degraded. The pattern of substantially degraded memory cells may then be used to determine the encoded value "10111001."

As an example, the memory controller 120 may perform a program operation such that the bit value stored in each memory cell 231-238 is forced to a "0". The memory controller 120 may then perform a partial erase operation such that bit values in the memory cells 231, 233-235, and 238 are transitioned to a "1" but the bit values in memory cells 232, 236, and 237 remain a "0," as shown by FIG. 6. This partial erase operation may be performed by transmitting an erase request from the memory controller 120 to the memory chip 140 in which the memory cells 231-238 reside. This erase request may request the memory chip 140 to erase all of the memory cells 231-238. In response to this request, the memory chip 140 begins erasing the memory cells 231-238 in a block, noting that such an erasure requires a finite amount of time. Before completion of this finite amount of time, the memory controller 120 causes the memory chip 140 to stop the erasure, such as by transmitting a reset request or other type of instruction that causes interruption of the erase operation being performed by the memory chip 140. Since the performance of the memory cells 232, 236, and 237 are substantially degraded, erasing of these cells is slower than the erasing of the memory cells 231, 233-235, and 238 that have not been substantially degraded. Further, the timing of the erase request and the reset request (or other instruction for interrupting the erase operation) is preferably controlled so that the erase operation is stopped before the values in the substantially degraded cells 232, 236, and 237 have transitioned. Thus, the memory controller 120 can distinguish the substantially degraded memory cells 232, 236, and 237 from the other memory cells 231, 233-235, and 238 based on the bit values stored in the memory cells 231-238 after performance of the program and partial erase operations. In this example, the eight-bit data value stored in the memory cells 231-238 after the program and partial erase operations is the encoded data value. In other examples, such as when an erase operation followed by partial program operation are used, further manipulation of the bit values (e.g., flipping of the bit values) may be performed to recover the encoded data value.

Note that it is unnecessary for the same memory controller 120 be used both for converting the multiple programmable memory to OTP memory encoded with a data value and for recovering the data value from the converted memory. As an example, during manufacturing, a manufacturer of the memory chip 140 may use the techniques described herein to encode a data value into a group of memory cells. Thereafter, the memory chip 140 may be sent to a manufacturer of the memory system 110 that places the memory chip 140 on a printed circuit board (PCB) with a different memory controller 120 that is configured to recover the data value encoded by the chip manufacturer. As a mere example, the chip manufacturer may use the techniques described herein to encode the date or year of manufacture of the chip 140 into the group of memory cells, and the memory controller 120 of a device or system manufacturer or user may read the encoded data value. In other examples, other reasons for using different memory controllers for encoding and reading the OTP value are possible.

Figure 4:
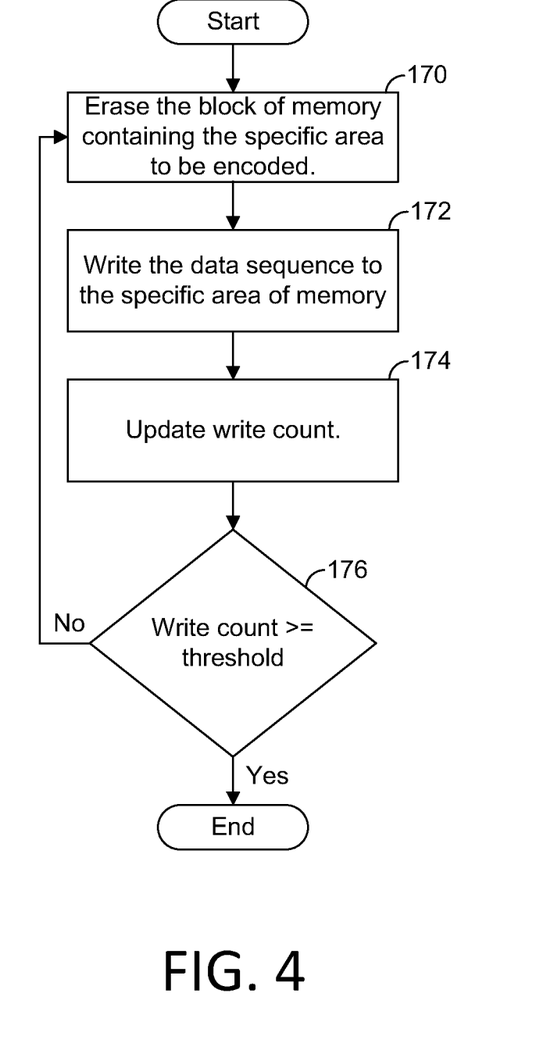
FIG. 4 is a flowchart illustrating an exemplary method for converting flash memory, such as is depicted by FIG. 2, into one-time programmable memory.

The accelerated deterioration of select memory cells 130 to encode a select data sequence into the memory may be performed in a few different ways. For example, FIG. 4 is a block diagram illustrating an exemplary method of converting the flash memory depicted by FIG. 3 into one-time programmable memory by using successive program and erase operations to cause select memory cell 130 deterioration. In some embodiments, the memory cells 130 that change values during a memory operation experience greater stress and therefore greater deterioration relative to memory cells that do not change value. At step 170, the specific area of memory where a data sequence is to be stored is erased by the memory controller 120 (e.g., specific one or more blocks of memory). In this regard, the memory controller 120 may transmit a request to erase the cells in an area of memory identified by the request, and the memory chip 140 having such area of memory may then perform the requested operation. In this regard, to perform the erase operation, the memory chip 140 may, for each memory cell to be erased, set a high voltage on the substrate 32 and a low voltage on the control gate 49 causing electron tunneling from the floating gate 52 to the substrate 32. Erased memory cells 130 usually force the value stored therein to a logical high bit value (i.e., a bit value of "1"). An erase operation may erase each memory cell 130 on a block.

At step 172, the specified data sequence is programmed into the specified area of memory by the memory controller 120. That is, the memory controller 120 transmits a program request requesting the memory chip 140 to write the data sequence at the location in memory to be encoded with the data sequence. In response, the memory chip 140 writes the data sequence as requested. In some embodiments, this may involve setting a high voltage on the control gates 49 of the memory cells 130 of a page to be programmed and a low voltage on the substrate 32 by setting appropriate bit line voltages causing electron tunneling to the floating gate 52 from the substrate 32 of the memory cells 130 to be programmed and not the other memory cells 130 of the page. Programmed memory cells 130 usually force the value stored therein to a logical low bit value (i.e., a bit value of "0"). Thus, during the programing operation, the programmed set of memory cells 130 change their bit values (e.g., from logical high or "1" to logical low or "0"), and values in the remaining memory cells 130 remain the same. In some embodiments, the memory cells 130 having values that change experience stress by the change, and the memory cells 130 having values that do not change are not significantly stressed. At step 174, the write count is updated.

At step 176, the memory controller 120 determines if the write count is greater than or equal to a predetermined threshold. If the write count is not greater than or equal to the predetermined threshold, control returns to step 170. If the write count is greater than or equal to the predetermined threshold, then the method ends. The additional stresses on the memory cells 130 storing values that are changed by the repeated erase and program operations cause accelerated degradation on these memory cells 130. Whereas the memory cells 130 storing values that are not changed by the repeated erase and program operations do not experience this stress and do not significantly degrade.

In some embodiments, the predetermined threshold is selected by a user and programmed into the memory controller 120. The predetermined threshold is set sufficiently high to ensure that performances of cells 130 storing values changed by the program and erase operations are substantially degraded. In some embodiments, instead of using a fixed number of write counts, the memory cell physical characteristics may be tested to see when the performances of the memory cells 130 have been substantially degraded. As an example, after a number of repeated program and erase operations, as described above, the memory cells may be read using the exemplary method described in more detail below. If the read value matches the data value being written by the program operations, then the performances of the select memory cells 130 have been sufficiently degraded by the repeated program and erase operations such that further programming and erasing, as described above is unnecessary to encode the memory with the data value being written. In other embodiments, other techniques for determining when the data value as been successfully encoded into the memory are possible.

While repeated programming and erasing of the memory are described above, other memory operations may be used to achieve a similar effect. In this regard, any memory operation that changes the values stored in select memory cells may be used to selectively degrade performances of the memory cells for the purpose of converting the memory into OTP memory with an encoded data value.

Figure 5:
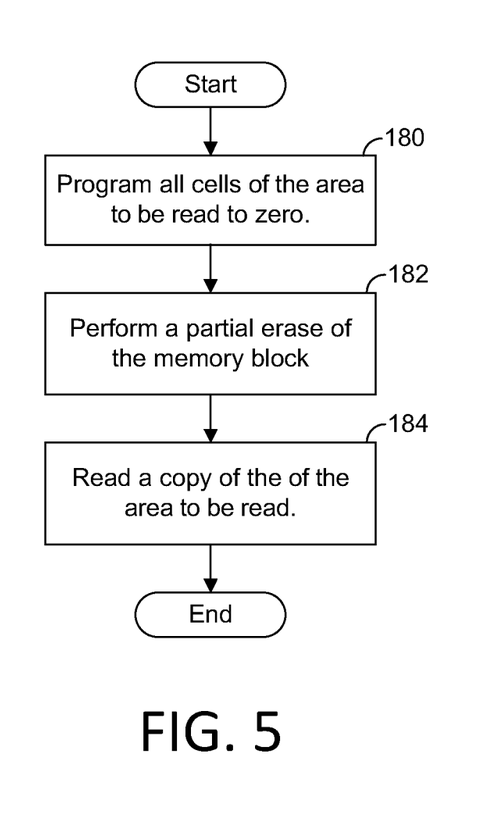
FIG. 5 is a flowchart illustrating an exemplary method for reading a portion of flash memory converted to one-time programmable memory.

To read the encoded data from the memory that has been converted to OTP memory, the specific memory location may be checked for characteristics of substantial degradation (e.g., wear or aging). For example, FIG. 5 is a block diagram illustrating an exemplary method for reading the encoded OTP. At step 180, the memory controller 120 performs one or more program operations to program all cells of the area to be read to a logical low value (e.g., "0"). At step 182, the memory controller 120 then performs a partial erase of the memory block (e.g., in a manner similar to that outlined above for the erase operations described in the context of FIG. 4, except as will be described shortly). At step 184, after performing the partial erase operation, the memory controller 120 reads the portion of memory converted to OTP. Because of memory cell degradation, the degraded memory cells 130 will take longer to transition during programming or erase operations and therefore will not be changed by the partial erase operation. Memory cells 130 that were not fully erased by the partial erase operation are determined to be substantially degraded or aged and may be treated as zeros and the remaining memory cells 130 may be treated as ones (or vice versa depending on the desired encoding preferences).

In some embodiments, memory controller 120 performs a partial erase at step 182 by starting an erase operation, as previously described above. In this regard, the memory controller 120 transmits an erase request to the memory chip 140 having the converted OTP memory encoded with the data value. In response, the memory chip 140 sets the voltages applied to the memory cells 130 of this OTP memory as appropriate to commence erasure of such memory cells. This operation takes a finite amount of time. Before the full period for performing the erase operation, the memory controller 120 transmits an instruction, such as a reset commence, that causes the memory chip 140 to stop the erase operation. Thus, the erase operation is interrupted before its normal time for completion. While the instant embodiment is described as programming the memory then performing a partial erase, other techniques are possible, such as erasing the memory then performing a partial programming.

Encoding and reading techniques have been described above in the context of converting multiple programmable memory into one-time programmable memory. These principles have been explained in detail with regards to flash memory but the same principles may apply to other memory technologies which exhibit detectable changes due to wear or degradation.

The foregoing is merely illustrative of the principles of this disclosure and various modifications may be made by those skilled in the art without departing from the scope of this disclosure. The above-described embodiments are presented for purposes of illustration and not of limitation. The present disclosure also can take many forms other than those explicitly described herein. For instance, the order of particular steps or the form of particular processes can be changed in some cases to perform equivalent steps. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

Now, therefore, the following is claimed:

1. A memory system, comprising:
    multiple programmable memory having memory cells; and
    a memory controller configured to convert a portion of the multiple programmable memory into one-time programmable memory permanently encoded with a data value by selecting a first plurality of the memory cells based on the data value and, for each of the selected first plurality of the memory cells, repetitively changing a bit value stored in the respective memory cell of the first plurality of the memory cells a sufficient number of times to substantially degrade performance of the respective memory cell of the first plurality of the memory cells.

2. The memory system of claim 1, wherein the memory controller is configured to change the bit values stored in the first plurality of the memory cells by repetitively writing the data value to the portion and erasing the portion.

3. The memory system of claim 1, wherein each of the first plurality of the memory cells corresponds to a respective bit of the data value at a first logical level, wherein each of a second plurality of the memory cells corresponds to a respective bit of the data value at a second logical level, and wherein the portion is encoded with the data value such that performance of each of the second plurality of the memory cells is not substantially degraded.

4. The memory system of claim 1, wherein the multiple programmable memory is flash memory.

5. A memory system, comprising:
    multiple programmable memory having a plurality of memory cells; and
    a memory controller configured to permanently encode a data value on the plurality of memory cells, wherein the memory controller is configured to permanently encode the data value by successively performing program-erase (PE) cycles on the plurality of memory cells a sufficient number of times to substantially degrade performance of at least one of the memory cells such that a pattern of the memory cells with degraded performance is indicative of the data value, wherein for each of the PE cycles, the memory controller is configured to write the data value to the plurality of memory cells and erase the plurality of memory cells.

6. The system of claim 5, wherein the multiple programmable memory is a flash memory.

7. A method for permanently encoding a data value onto memory cells of multiple programmable memory, comprising:
    selecting a first plurality of the memory cells based on the data value; and
    for each of the selected first plurality of the memory cells, repetitively changing a bit value stored in the respective memory cell of the first plurality of the memory cells a sufficient number of times to substantially degrade performance of the respective memory cell of the first plurality of the memory cells.

8. The method of claim 7, wherein the changing comprises repetitively writing the data value to the portion and erasing the portion.

9. The method of claim 7, wherein each of the first plurality of the memory cells corresponds to a respective bit of the data value at a first logical level, wherein each of a second plurality of the memory cells corresponds to a respective bit of the data value at a second logical level, and wherein the portion is encoded with the data value such that performance of each of the second plurality of cells is not substantially degraded.

10. The method of claim 7, wherein the multiple programmable memory is flash memory.

\* \* \* \* \*